United States Patent
Davies

(10) Patent No.: US 6,281,549 B1
(45) Date of Patent: Aug. 28, 2001

(54) MOSFET COMPONENT

(75) Inventor: Neil Davies, Sonnenbuehl-Genkingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/344,133

(22) Filed: Jun. 24, 1999

(30) Foreign Application Priority Data

Jun. 26, 1998 (DE) .............................................. 198 28 494

(51) Int. Cl.[7] .................................................. H01L 29/76
(52) U.S. Cl. ............................................ 257/343; 257/335
(58) Field of Search ................................... 257/335, 343

(56) References Cited

U.S. PATENT DOCUMENTS 3,412,297 * 11/1968 Amlinger .............................. 257/330
4,803,532 * 2/1989 Mihara ................................. 257/335

FOREIGN PATENT DOCUMENTS

| 30 93 803 | 5/1981 | (DE) . |
|---|---|---|
| 197 25 091 | 12/1998 | (DE) . |
| 0 841 702 | 5/1998 | (EP) . |
| 56-88363 | 7/1981 | (JP) . |
| 1-140773 | 6/1989 | (JP) . |
| 11-74517 | 3/1999 | (JP) . |
| 11-307763 | 11/1999 | (JP) . |
| 11-330451 | 11/1999 | (JP) . |

* cited by examiner

Primary Examiner—Sara Crane
(74) Attorney, Agent, or Firm—Kenyon & Kenyon

(57) ABSTRACT

A MOSFET component used to switch high currents includes a current path that is parallel-connected to the base-emitter link of the parasitic bipolar transistor, extracts the minority charge carriers, and prevents the parasitic transistor from being biased into conduction.

7 Claims, 2 Drawing Sheets

MOSFET COMPONENT

BACKGROUND INFORMATION

A MOSFET component in which a means is provided for protecting against the through-switching of a parasitic transistor is described in German Patent No. 30 39 803. A method is also described in German Patent No. 197 25 091 by which MOSFET components having a p-type trough region, in which a heavily n-type doped source region is embedded, are provided with a heavily p-type doped region within the p-type trough, with this p-type region extending all the way to the n-type region located beneath the p-type trough and/or stretching laterally beneath the source region. Providing such a heavily p-typed doped region is not suitable for mixed processes if one wishes to avoid additional manufacturing process steps. In addition, a heavily p-type doped region limits the ability to scale down the component.

SUMMARY OF THE INVENTION

An object of the present invention is to provide reliable protection against the through-switching of a parasitic transistor, which would inevitably lead to irreversible damage to the component due to high currents, using simple means and at no additional expense.

It is particularly advantageous to scale down the component so that, for example, the p-type trough has a depth of less than 1 μm. This produces a submicron MOS arrangement which can be operated with the usual threshold voltages, but with drain-to-source voltages of only 40 V instead of 60–80 V. With methods according to the related art, such compact, space-saving components make it difficult or even impossible to protect against parasitic bipolar effects. If the threshold voltage is set to the usual values even in the submicron arrangement, a higher doping of the p-type trough is necessary. In spite of this higher p-type doping, the resistance of the resistor formed by p-type regions of the p-type trough beneath the source region (referred to below as the pass-under resistor) increases, thus heightening the susceptibility to parasitic bipolar effects, since the space-charge effect between the p-type trough and the underlying n-type region becomes more significant in very shallow p-type troughs. However, protective measures, such as the deep p-type diffusions known from the related art, cannot be used with scaled-down p-type troughs that are less than 1 micrometer deep. A compact component that is reliably protected against through-switching of the parasitic transistor can be provided only by combining a submicron structure with a p-type path connected in parallel to the pass-under resistor.

A design based on DMOS technology allows the component to be further miniaturized, at the same time increasing its current carrying capacity. Particularly in the case of DMOS components, there is great danger of the minority charge carriers generated in the areas of the n-type region adjacent to the channel regions passing through the narrow channel region and flowing through the pass-under resistor. A p-type conductive path that is connected in parallel to the pass-under resistor is therefore especially advantageous, particularly in the case of DMOS components.

When using lateral components, in particular, high field strengths can also be expected in the areas of the n-type region adjacent to the channel regions, thus producing a large number of holes in these regions and resulting in a high hole current flowing through the pass-under resistor. The parallel-connected path can therefore be used to advantage particularly in the case of lateral components.

By selecting the area ratio between the source and auxiliary regions, the component can be set to a low drain-to-source starting resistance or to a highly efficient extraction of the minority charge carriers, which are undesirable because they produce parasitic effects, depending on the application.

The arrangement according to the present invention can be used in the same manner with reversed doping.

BRIEF DESCRIPTION OF THE DRAWINGS

FIG. 1c shows a top view of the arrangement of FIG. 1a.

FIG. 2b shows a first side view of the arrangement of FIG. 2a.

FIG. 2c shows a second side view of the arrangement of FIG. 2a.

DETAILED DESCRIPTION

Figure 1A:
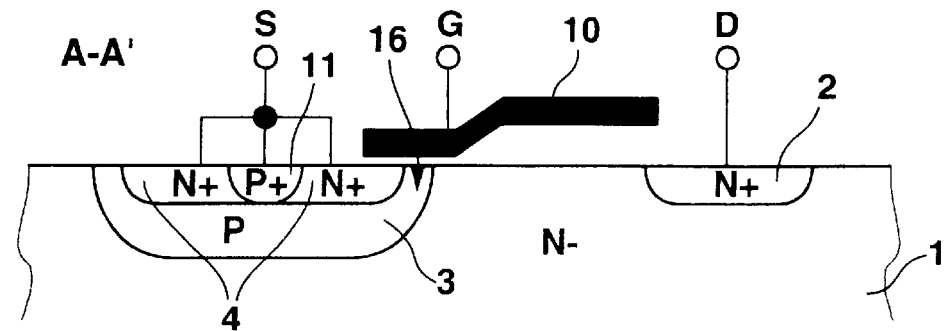
FIG. 1a shows a side view of a first arrangement without a MOSFET component.

FIG. 1a shows a cross-sectional side view of a MOSFET component in which the insulating layers (e.g. between the gate electrode and the semiconductor surface) are left out in the interest of simplicity. A p-type trough 3 is provided in an n-type region 1, which can be contacted with a drain terminal D via a heavily n-type doped drain region 2. A heavily n-type doped source region 4 is located in p-type trough 3. Source terminal S is electrically connected to source region 4 and to a heavily p-type doped contacting region 11, which contacts p-type trough 3. A channel region 16 of p-type trough 3 provided between source region 4 and n-type region 1 can be controlled by a polysilicon gate electrode 10 provided with a gate terminal G.

The arrangement represents a MOSFET component in which a current flows between the drain and source contacts when a positive voltage is present at the drain contact and when a positive potential with respect to the source region is applied to the gate electrode.

Figure 1B:
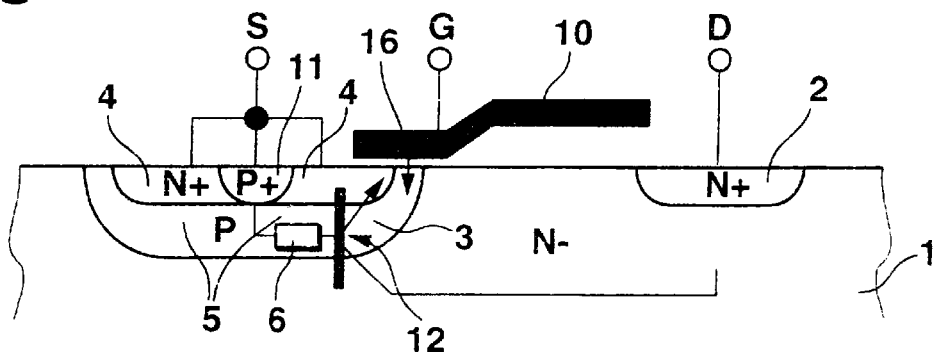
FIG. 1b shows a side view of a second arrangement without a MOSFET component.

FIG. 1b shows the same cross-sectional side view A-A' as FIG. 1a, but with an additional equivalent circuit drawn in for parasitic transistor 12, whose emitter is formed by source region 4, its base by p-type trough 3, and its collector by n-type region 1. The base of parasitic transistor 12 is connected to source terminal S via a pass-under resistor 6, with pass-under resistor 6 being formed by p-type regions 5 of p-type trough 3 beneath source region 4.

Due to the avalanche effect, holes are produced as minority charge carriers in n-type region 1, in particular close to channel region 16. These holes drift to the p-type trough and flow through pass-under resistor 6. When this provides the base-to-emitter voltage needed to bias parasitic transistor 12 into conduction, a very high current immediately flows between the source and drain terminals, producing irreversible damage to the component.

Figure 1C:
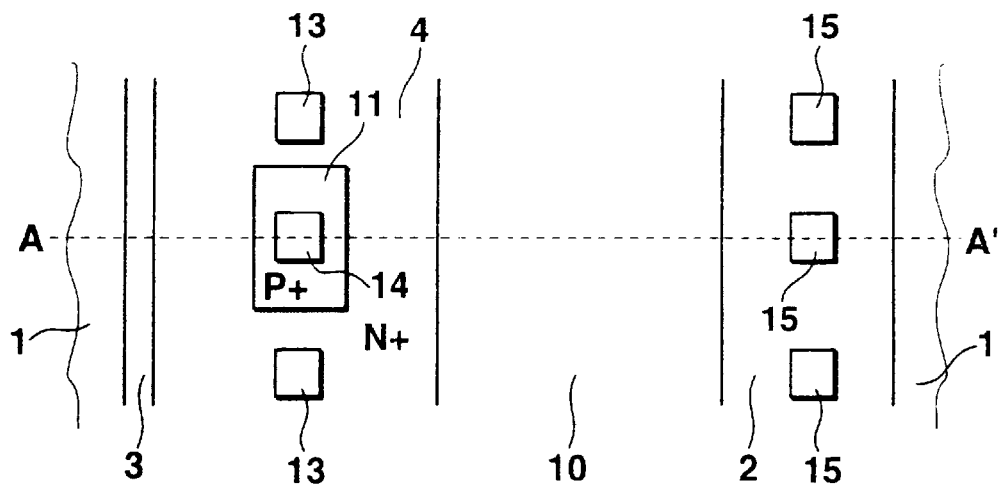

FIG. 1c shows a top view of the component illustrated by the cross-sectional side view in FIG. 1a, with the cross-section A-A' shown in FIG. 1a being marked by a broken line in FIG. 1c. Drain region 2, gate electrode 10, and source region 4 are arranged parallel to one another in stripes. Drain region 2 is provided with drain contacts 15 which, combined, form drain terminal D. Source region 4 is provided with source contacts 13 which, combined, form source terminal S. Contacting regions 11 incorporated into source region 4 in the form of islands are provided with contacts 14. The representation in FIG. 1c continues in an upward and downward direction, which means that source contacts 13 and contacts 14 of contacting regions 11 alternate.

As shown in FIG. 1c, the minority charge carriers described above must pass through p-type regions 5 before finally flowing to source terminal S via contacting regions 11.

Figure 2A:
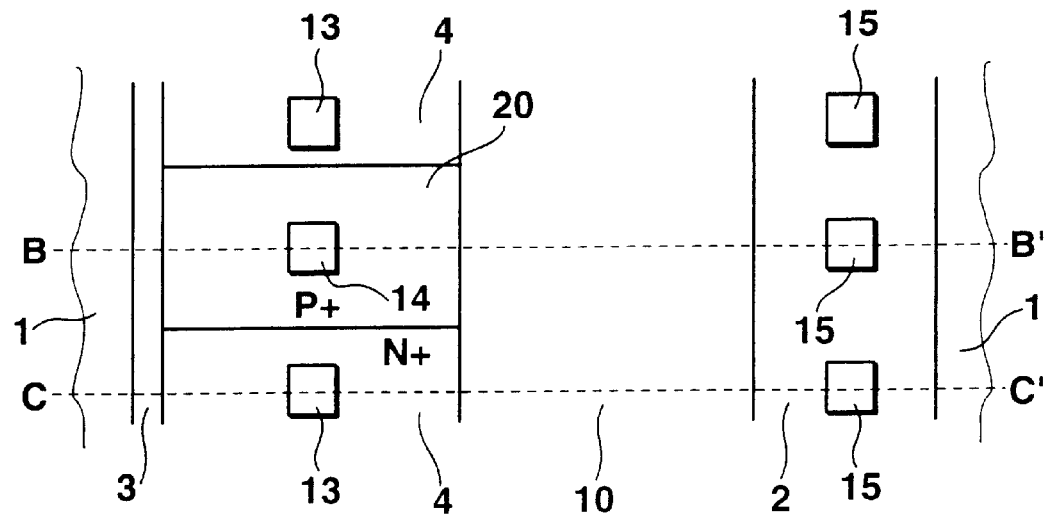
FIG. 2a shows a top view of an arrangement with a MOSFET component having a p-type conductive path that is parallel-connected to the pass-under resistor.
Figure 2B:
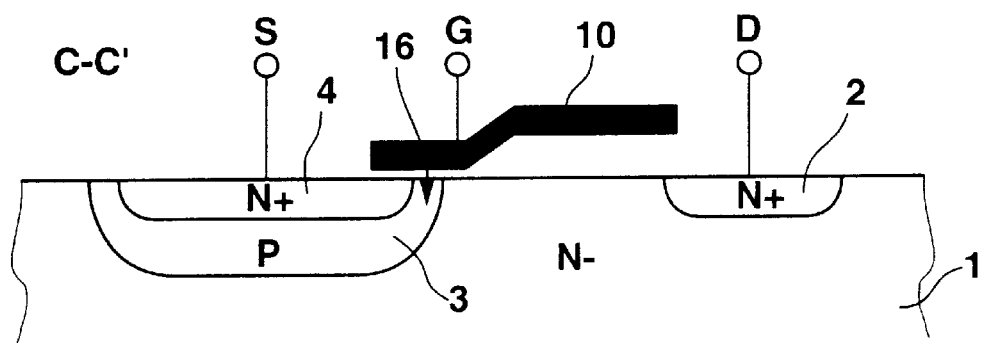
Figure 2C:
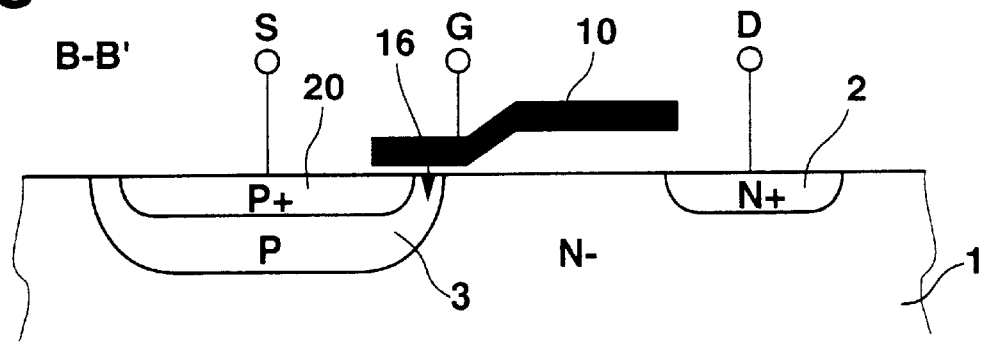

FIG. 2a shows a top view of a MOSFET component according to the present invention. The same components illustrated in FIG. 1 are identified by the same reference numbers and are not explained again here. Source regions 4 and heavily p-type doped auxiliary regions 20, which each extend all the way to channel region 16, are embedded in p-type trough 3 in alternating sequence. Like contacting regions 11 shown in FIG. 1, heavily p-type doped auxiliary regions 20 are provided with contacts 14. The broken lines identified by B and B' and by C and C', mark the positions of the cross-sectional side views illustrated in FIG. 2c and FIG. 2b, respectively. Only heavily n-type doped source region 4 in p-type trough 3 is visible in FIG. 2b, while only auxiliary region 20 is visible in offset position B-B' shown in FIG. 2c.

Cross-section C-C' shows the components needed for each MOSFET component to function. P-type trough 3 is contacted via heavily p-type doped auxiliary regions 20 shown in FIG. 2c, shifted to one side. In this arrangement, minority charge carriers produced close to channel region 16 in n-type region 1 can flow around one side of source region 4 by extracting them directly from heavily p-type doped auxiliary regions 20. This reduces the danger of biasing the parasitic bipolar transistor into conduction since considerably fewer holes now flow through p-type regions 5.

In an alternative embodiment, contacting regions 11, like those illustrated in FIGS. 1a–1c, can be provided. Although this once again slightly increases the danger of minority charge carriers flowing though the pass-under resistor, it also improves contacting of p-type trough 3 in cross-section C-C'. This allows a large portion of the minority charge carriers to flow away directly via auxiliary regions 20. In an alternative embodiment of this type, at least two contacts not illustrated in FIGS. 2a–2c), instead of only one contact 13, are provided along line C-C': at least one source contact 13 for contacting source region 4 and one further contact 14 for contacting region 11, which can be optionally connected to auxiliary region 20 in one piece.

The arrangement according to the present invention is particularly advantageous for submicron structures, for example if p-type trough 3 is less than 1 μm deep, measured from the surface of drain region 1. In a further alternative embodiment, the entire area selected for auxiliary region 20 is smaller than the area of source region 4, thus ensuring a low drain-to-source starting resistance ($R_{DS,ON}$) while maintaining a high level of protection against parasitic bipolar effects.

What is claimed is:

1. A MOSFET component comprising:
   a lightly n-type doped region;
   a p-type trough incorporated into the lightly n-type doped region;
   a heavily n-type doped source region situated in the p-type trough;
   a parasitic transistor, the source region being an emitter of the transistor, the p-type trough being a base of the transistor, the n-type doped region being a collector of the transistor, the transistor having a base-emitter link;
   a pass-under resistor formed by a p-type region of the p-type trough beneath the source region; and
   a p-type conductive path parallel-connected to the base-emitter link of the transistor, the conductive path having a heavily p-type doped auxiliary region parallel-connected to the pass-under resistor, the heavily p-type doped auxiliary region being incorporated in the p-type trough, wherein:
      the source region and the heavily p-type doped auxiliary region are incorporated in the p-type through in an alternating sequence, and
      the source region and the heavily p-type doped auxiliary region extend from a first side of the p-type trough to a channel region on a second side of the p-type trough.

2. The MOSFET component according to claim 1, wherein the p-type trough has a depth of less than one micrometer.

3. The MOSFET component according to claim 1, wherein the component is a DMOS technology component.

4. The MOSFET component according to claim 1, further comprising a heavily n-type doped drain region situated in the lightly n-type doped region.

5. The MOSFET component according to claim 1, wherein the conductive path has a partial path formed by a heavily p-type doped contacting region, the contacting region being series-connected to the pass-under resistor.

6. The MOSFET component according to claim 1, wherein the auxiliary region is smaller than the source region.

7. A MOSFET component comprising:
   a lightly p-type doped region;
   an n-type trough incorporated into the lightly p-type doped region;
   a heavily p-type doped source region situated in the n-type trough;
   a parasitic transistor, the source region being an emitter of the transistor, the n-type trough being a base of the transistor, the p-type doped region being a collector of the transistor, the transistor having a base-emitter link;
   a pass-under resistor formed by an n-type region of the n-type trough beneath the source region; and
   an n-type conductive path parallel-connected to the base-emitter link of the transistor, the conductive path having a heavily n-type doped auxiliary region parallel-connected to the pass-under resistor, the heavily n-type doped auxiliary region being incorporated in the n-type trough, wherein:
      the source region and the heavily n-type doped auxiliary region are incorporated in the n-type trough in an alternating sequence, and
      the source region and the heavily n-type doped auxiliary region extend from a first side of the n-type trough to a channel region on a second side of the n-type trough.

* * * * *